United States Patent [19]

Smith

[11] Patent Number: 5,821,892
[45] Date of Patent: Oct. 13, 1998

[54] DIGITAL TO ANALOG CONVERSION SYSTEM

[75] Inventor: Sterling L. Smith, Plano, Tex.

[73] Assignee: Texas Instruments Incorporated, Dallas, Tex.

[21] Appl. No.: 752,121

[22] Filed: Nov. 20, 1996

[51] Int. Cl.⁶ .................................................... H03M 1/80
[52] U.S. Cl. .......................................... 341/150; 341/143
[58] Field of Search ................................... 341/143, 144, 341/150, 153

[56] References Cited

U.S. PATENT DOCUMENTS

| | | | |
|---|---|---|---|
| 4,414,641 | 11/1983 | Jarrett ....................................... | 364/728 |
| 4,992,792 | 2/1991 | Mori et al. .............................. | 341/147 |
| 5,182,559 | 1/1993 | Tokuyama ................................ | 341/144 |
| 5,534,863 | 7/1996 | Everitt et al. ............................ | 341/150 |
| 5,592,165 | 1/1997 | Jackson et al. .......................... | 341/143 |

OTHER PUBLICATIONS

Rinaldo Castello, et al., "Performance Limitations in Switched–Capacitor Filters," Reprinted from *IEEE Transactions on Circuits and Systems*, vol. CAS–32, No. 9, Sep., 1985, pp. 865–876.

Peter J. A. Naus, et al., "A CMOS Stereo 16–bit D/A Converter for Digital Audio," Source Unknown, Reprinted from *IEEE J. Solid–State Circuits*, vol. SC–22, pp. 390–395, Jun. 1987, pp. 486–490.

Paul J. Hurst, et al., "Finite Impulse Response Switched–Capacitor Filters for the Delta–Sigma Modulator D/A Interface," *IEEE Transactions on Circuits and Systems*, vol. 38, No. 11, Nov., 1991, pp. 1391–1397.

David K. Su, et al., "A CMOS Oversampling D/A Converter with a Current–Mode Semi–Digital Reconstruction Filter," *Applied Electronics Lab (and supported by the Semiconductor Research Corporation)*, Date Unknown, pp. 1–30.

*Primary Examiner*—Marc S. Hoff
*Attorney, Agent, or Firm*—Alan K. Stewart; Wade James Brady, III; Richard L. Donaldson

[57] ABSTRACT

A digital to analog conversion system (10) includes a noise shaper (14) and a digital to analog converter (16). The digital to analog converter (16) includes a series of weighted taps (32, 102) with switched capacitor circuitries (42, 106, 108). The digital to analog converter (16) also includes an amplifier (36, 120) having an associated integrating capacitor (62, 122, 130). The switched capacitor circuitries (42, 106, 108) include capacitors (46) that are coupled in parallel to integrating capacitors (62, 122, 130) by common busses (34, 114, 115).

20 Claims, 2 Drawing Sheets

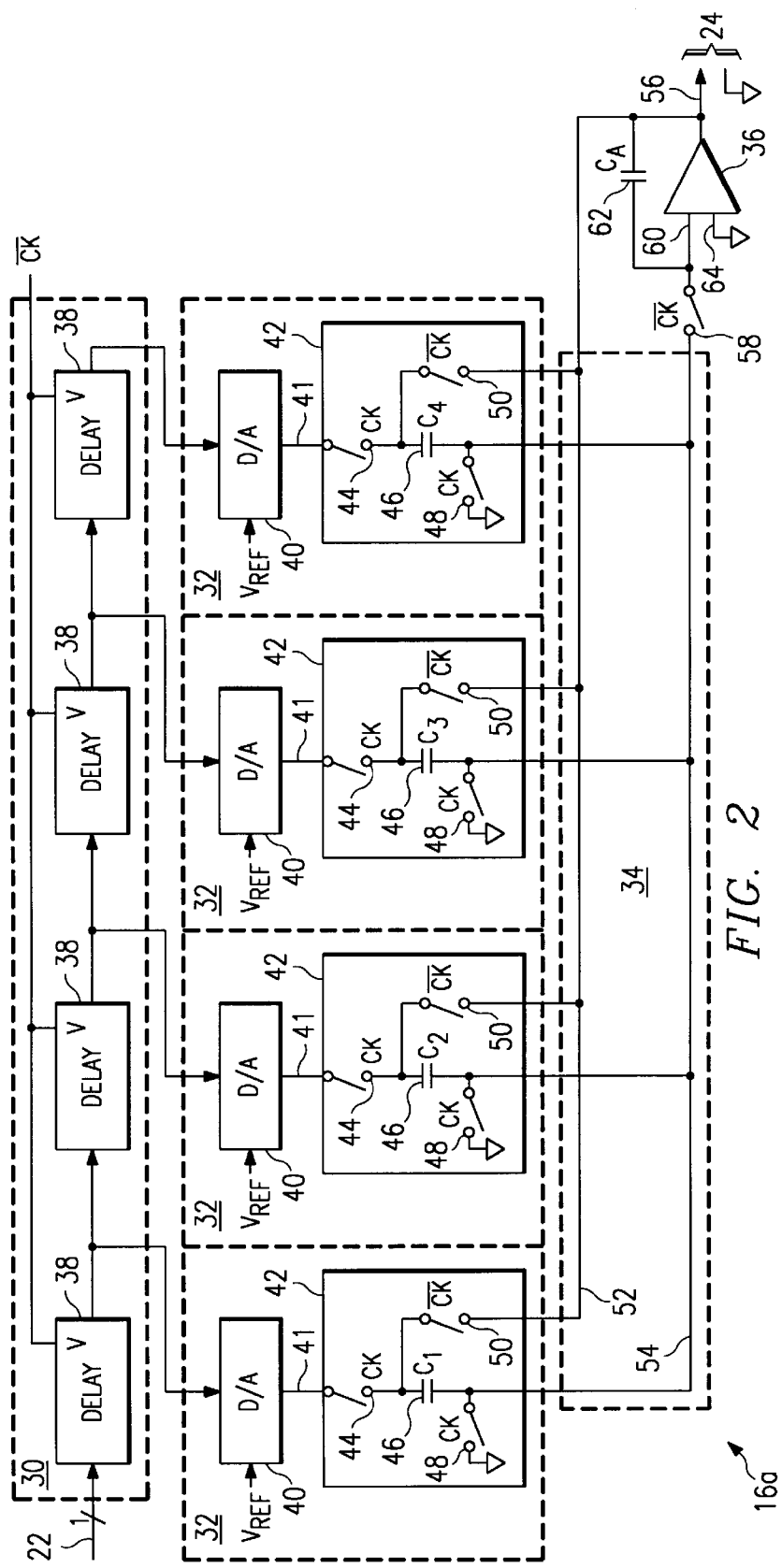

5,821,892

DIGITAL TO ANALOG CONVERSION SYSTEM

TECHNICAL FIELD OF THE INVENTION

This invention relates in general to signal processing, and more particularly to a digital to analog conversion system.

BACKGROUND OF THE INVENTION

Many electronic systems manipulate both digital and analog signals. To perform their intended function, these systems may convert digital signals into analog signals. For example, an audio device may convert digital signals into analog signals to drive a speaker. Advances in multimedia and other related technologies indicate a need for high resolution and low noise digital to analog conversion systems.

A traditional multibit converter with voltage tap points suffers from inaccurate analog voltage outputs that may vary with temperature and fabrication differences. In addition, high resolution multibit converters may be expensive to build with prohibitive area and power consumption. Another approach, termed sigma-delta conversion, utilizes a noise shaper to perform digital to analog conversion. Both the multibit and sigma-delta approaches include a variety of noise producing components that degrade the signal-to-noise ratio of the converter.

SUMMARY OF THE INVENTION

In accordance with the present invention, a digital to analog conversion system is provided which substantially eliminates or reduces disadvantages and problems associated with prior digital to analog conversion systems.

In accordance with one embodiment of the present invention, a digital to analog converter is disclosed for converting a digital signal to an analog signal. The converter includes weighted taps, each weighted tap having an associated capacitor. Each weighted tap charges the associated capacitor in response to a bit of the digital signal. An amplifier has an integrating capacitor coupled to its input and output. A common bus couples the capacitors of the weighted taps and the integrating capacitor in parallel.

In accordance with another embodiment of the present invention, a digital to analog converter is disclosed for converting a digital signal to an analog signal. The converter includes weighted taps, each weighted tap having an associated first capacitor and second capacitor. Each weighted tap charges the first capacitor and the second capacitor in response to a bit of the digital signal. A first amplifier has a first integrating capacitor coupled to its input and output. A second amplifier has a second integrating capacitor coupled to its input and output. A first common bus couples the first capacitors of the weighted taps and the first integrating capacitor in parallel. A second common bus couples the second capacitors of the weighted taps and the second integrating capacitor in parallel.

Technical advantages of the present invention include a digital to analog conversion system with a decreased number of noise producing devices. In one embodiment, a single amplifier may be used in a high resolution digital to analog converter to reduce in-band noise. Furthermore, the single amplifier provides a continuous, non-sampled output which prevents aliasing of the wideband noise of the amplifier. Another technical advantage of the present invention is the use of a series of weighted taps having switched capacitor circuitry that tracks the filter bandwidth with changing frequency of the input bit stream. Furthermore, the present invention provides a low cost and high resolution digital to analog converter with lower area and power consumption than other prior art systems. Other technical advantages are readily apparent to one skilled in the art from the following descriptions, figures, and claims.

BRIEF DESCRIPTION OF THE DRAWINGS

For a more complete understanding of the present invention and its advantages, reference is now made to the following description taken in conjunction with the accompanying drawings, in which:

FIG. 1 illustrates a digital to analog conversion system;

FIG. 2 illustrates one embodiment of a digital to analog converter; and

DETAILED DESCRIPTION OF THE INVENTION

Figure 3:
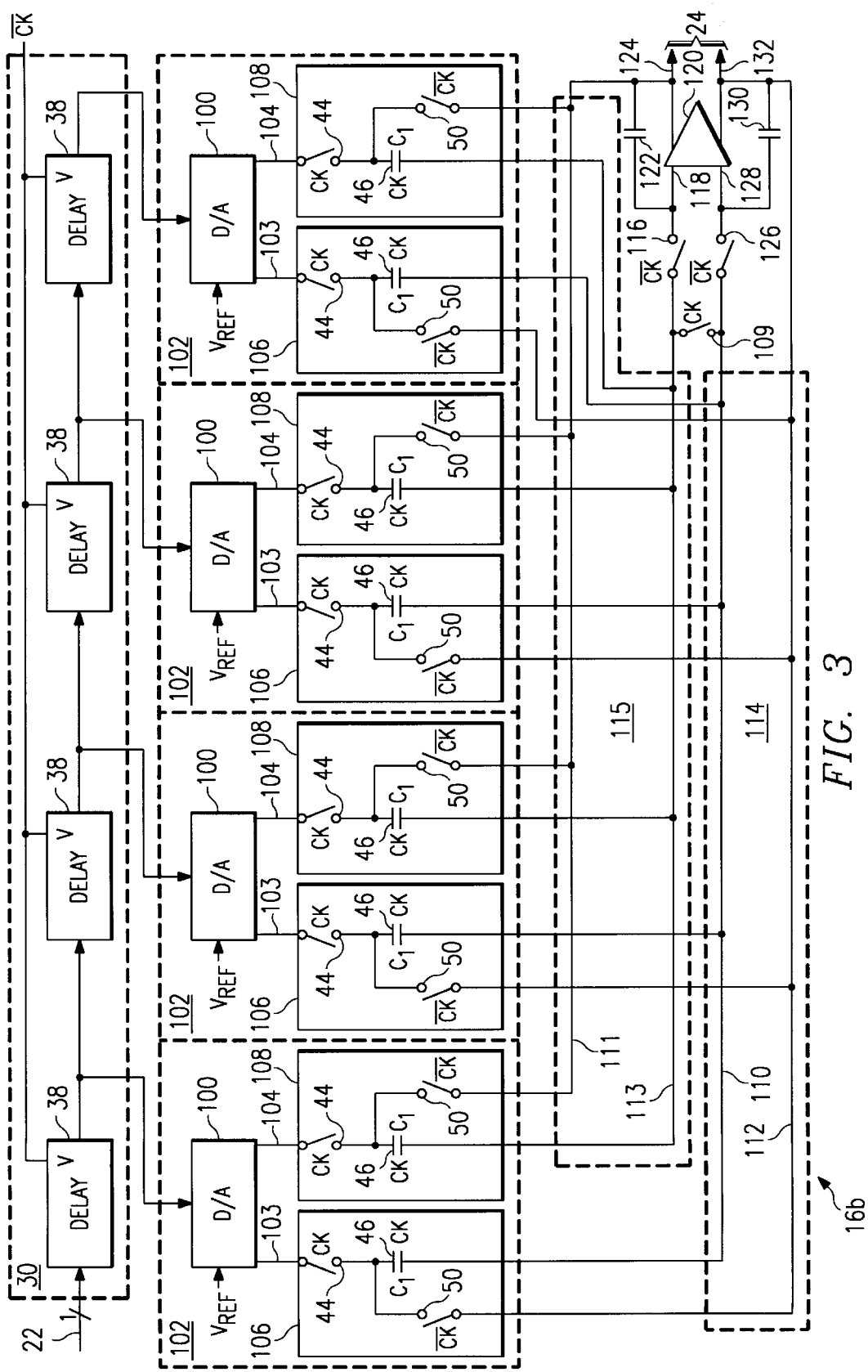
FIG. 3 illustrates another embodiment of a digital to analog converter.

FIG. 1 illustrates a digital to analog conversion system 10 that includes an interpolation filter 12, a noise shaper 14, and a digital to analog converter 16. In general, system 10 converts a series of discrete digital values into an analog signal.

In operation of system 10, interpolation filter 12 receives a digital signal 18 that comprises a series of n-bit digital words. Interpolation filter 12 generates additional interpolated values to add to digital signal 18 to produce an interpolated signal 20. For example, if interpolation filter 12 adds three additional interpolated values for each n-bit digital word in digital signal 18, then interpolated signal 20 comprises a series of n-bit digital words at a frequency that is four times the frequency of digital signal 18. Interpolation filter 12 may utilize any suitable technique for oversampling or interpolation to produce interpolated signal 20. Both digital signal 18 and interpolated signal 20 are multibit signals that have the same or different word lengths, depending on the desired requirements or specific implementation of system 10.

Noise shaper 14 receives interpolated signal 20 and produces a single bit signal 22. Noise shaper 14 may utilize a sigma-delta technique or any other suitable technique to convert n-bit digital words in interpolated signal 20 into single bit signal 22. For example, noise shaper 14 may be a second-order device comprising a quantizer which reduces the word length to one bit, a limiter which prevents overflow, and a loop filter for shaping the spectral distribution of the quantized noise. Other designs of a noise shaper would be apparent to one skilled in the art. In one embodiment, the frequency of single bit signal 22 is greater than the frequency of interpolated signal 20 by an integer multiple. Digital to analog converter 16 converts single bit signal 22 into an analog signal 24.

FIG. 2 illustrates one embodiment of digital to analog converter 16a which converts single bit signal 22 into analog signal 24. The major components of converter 16a are a delay line 30, weighted taps 32, a common bus 34, and an amplifier 36. Delay line 30 comprises delays 38 arranged in series with the first delay in the series coupled to single bit signal 22. Each delay 38 is operable to delay single bit signal 22 by one bit as it passes through delay line 30. In a particular embodiment, delays 38 propagate a bit of single bit signal 22 in response to an active low clocking signal $\overline{CK}$. Delays 38 may be flip-flops, memory elements, or other suitable devices that can recover or isolate bits from single bit signal 22.

A weighted tap 32 is coupled to the output of each delay 38 in delay line 30. Weighted tap 32 includes a single bit digital to analog converter 40 having a single voltage output 41 coupled to switched capacitor circuitry 42. Switched capacitor circuitry 42 comprises a switch 44 that couples voltage output 41 of single bit digital to analog converter 40 to a first terminal of capacitor 46. A second terminal of capacitor 46 is coupled to switch 48, which in turn is coupled to ground. The first terminal of capacitor 46 is coupled to a switch 50, which in turn is coupled to a conductor 52 of common bus 34. The second terminal of capacitor 46 is coupled to another conductor 54 of common bus 34. The chosen capacitance ($C_1$, $C_2$, $C_3$, $C_4$) of capacitors 46 determines a tap weight for each weighted tap 32.

Conductor 52 of common bus 34 is coupled to an output 56 of amplifier 36. Conductor 54 of common bus 34 is coupled to a switch 58, which in turn is coupled to an input 60 of amplifier 36. Input 60 of amplifier 36 is also coupled to an integrating capacitor 62, which in turn is coupled to output 56 of amplifier 36. Throughout this description, the term "integrating capacitor" is used to refer generally to a capacitor coupled to an input and an output of an amplifier. Another input 64 of amplifier 36 is coupled to ground. Capacitors 46 of switched capacitor circuitries 42 and integrating capacitor 62 are coupled in parallel by conductors 52 and 54 of common bus 34.

In operation, digital to analog converter 16a receives single bit signal 22 at the first delay 38 of delay line 30. Delays 38 propagate a bit from their input to their output in response to an active low clocking signal $\overline{CK}$. The output of delays 38 represents a series of bits in single bit signal 22. The output of each delay 38 is communicated to an associated weighted tap 32.

Weighted tap 32 receives its associated bit at the input of single bit digital to analog converter 40, which produces a voltage on voltage output 41 in response to the bit input. In one embodiment, voltage output 41 of single bit digital to analog converter 40 may be $+V_{REF}$ if the bit is a one or $-V_{REF}$ if the bit is a zero.

Switch 44 of switched capacitor circuitry 42 receives voltage output 41. Switches 44, 48, 50, and 58 operate in response to a high clocking signal CK and a low clocking signal $\overline{CK}$. In one embodiment, a high clocking signal CK represents the rising edge and a low clocking signal $\overline{CK}$ represents the falling edge of a clocking signal provided to analog to digital converter 16a. During a high clocking signal (CK), switches 44 and 48 are closed and switches 50 and 58 are opened. This allows charging of capacitor 46 by voltage output 41 from single bit digital to analog converter 40. Upon transition to a low clocking signal $\overline{CK}$, switches 44 and 48 are open and switches 50 and 58 are closed. This allows discharging of capacitors 46 which produces a flow of current on common bus 34.

In particular, capacitors 46 of switched capacitor circuitries 42 and integrating capacitor 62 are coupled in parallel by common bus 34, which allows a redistribution or weighted averaging of the charge on the capacitors. At the moment of transition to a low clocking signal $\overline{CK}$, each capacitor 46 has been charged to a voltage by its associated single bit digital to analog converter 40. Also at this moment, integrating capacitor 62 maintains a voltage $V_0$ across its plates. Upon transition to a low clocking signal $\overline{CK}$, the voltages ($V_{C1}$, $V_{C2}$, $V_{C3}$, $V_{C4}$) on capacitors 46 and the voltage $V_0$ on integrating capacitor 62 equalize using common bus 34. After the charges redistribute, the resulting voltage $V_1$ on integrating capacitor 62 is governed by the following equation:

$$V_1 = \frac{V_0 C_A + V_{C1} C_1 + V_{C2} C_2 + V_{C3} C_3 + V_{C4} C_4}{C_A + C_1 + C_2 + C_3 + C_4}$$

Due to the parallel arrangement of capacitors 46 of switched capacitor circuitries 42 and integrating capacitor 62, the voltage on output 56 of amplifier 36 is well-behaved and need not be sampled. This reduces the effects of aliased wideband noise. Analog signal 24 comprises the potential between output 56 of amplifier 36 and a reference voltage, such as ground.

Switched capacitor circuitries 42 and common bus 34 provides several technical advantages. As capacitors 46 are charged and discharged in response to clocking signals (CK and $\overline{CK}$), the filter bandwidth of converter 16a effectively tracks the frequency of single bit signal 22. This bandwidth tracking capability reduces the need to adjust capacitances ($C_1$, $C_2$, $C_3$, $C_4$) of capacitors 46 to maintain accurate and effective operation of converter 16a at different frequencies of single bit signal 22.

In addition, switched capacitor circuitries 42 cooperate with common bus 34 to reduce the number of noise producing components. When the frequency of single bit signal 22 is in the megahertz range or greater, thermal (kT/C) noise may dominate over flicker noise caused by component fabrication anomalies. The thermal noise of converter 16a is reduced by using a single amplifier 36. The sum of the capacitance values ($C_1$, $C_2$, $C_3$, $C_4$) of capacitors 46 may also be increased to reduce thermal noise. By reducing the overall number of noise producing components, converter 16a may be monolithic in design with reduced area and power consumption.

FIG. 3 illustrates another embodiment of digital to analog converter 16b that provides differential operation to minimize the effects of voltage surges, glitches, and other electrical interference in system 10. Converter 16b includes delay line 30 having delays 38 with outputs coupled to single bit digital to analog converters 100 of weighted taps 102. Instead of converters 40 described above with reference to FIG. 2, converters 100 provide a differential voltage across two voltage outputs 103 and 104 in response to a bit input.

Voltage outputs 103 and 104 of single bit digital to analog converter 100 are coupled to switched capacitor circuitries 106 and 108, respectively. The internal components of switched capacitor circuitries 106 and 108 are similar in structure and function to the internal components of switched capacitor circuitry 42 in FIG. 2, and therefore have been given the same reference numerals. Although the capacitances ($C_1$, $C_2$, $C_3$, C4) for the two capacitors 46 in each weighted tap are shown to be equal, capacitances may be chosen to be different for each switched capacitor circuitry 106 and 108, depending on the desired requirements or specific implementation of digital to analog converter 16b.

Switched capacitor circuitries 106 for weighted taps 102 are coupled to conductors 110 and 112 of common bus 114. Switched capacitor circuitries 108 for weighted taps 102 are coupled to conductors 111 and 113 of common bus 115. To reduce the number of noise producing elements in switched capacitor circuitries 106 and 108, switches 48 in each switched capacitor circuitry 42 of FIG. 2 are replaced by a single switch 109 that bridges conductor 113 of common bus 115 and conductor 110 of common bus 114. This provides the same functionality to charge capacitors 46 during a high clocking signal (CK).

Conductor 113 of common bus 115 is coupled to switch 116, which in turn is coupled to input 118 of amplifier 120. Input 118 is also coupled to an integrating capacitor 122, which in turn is coupled to output 124 of amplifier 120. Conductor 111 of common bus 115 is coupled to output 124 of amplifier 120. It should be understood that amplifier 120 may be one, two, or a combination of amplifiers. For example, amplifier 120 may be a pair of single output amplifiers.

Conductor 110 of common bus 114 is coupled to switch 126, which in turn is coupled to input 128 of amplifier 120. Input 128 is also coupled to an integrating capacitor 130, which in turn is coupled to output 132 of amplifier 120. Common bus 114 couples in parallel capacitors 46 of switched capacitor circuitries 106 and integrating capacitor 130. Common bus 115 couples in parallel capacitors 46 of switched capacitor circuitries 108 and integrating capacitor 122.

Digital to analog converter 16b operates in a similar fashion to digital to analog converter 16a, but utilizes additional circuitries to produce analog signal 24 as a differential voltage output. Delay line 30 receives single bit signal 22 and a series of bits are presented to weighted taps 32 in parallel by delays 38. Single bit digital to analog converter 100 of each weighted tap 102 receives a bit from the output of delay 38 and produces a differential output on voltage outputs 103 and 104 in response to the received bit. For example, voltage output 103 may be $+V_{REF}$ and voltage output 104 may be $-V_{REF}$ when the received bit is a one. Likewise, voltage output 103 may be $-V_{REF}$ and voltage output 104 may be $+V_{REF}$ when the received bit is a zero.

Switched capacitor circuitries 106 and 108 receive voltage outputs 103 and 104 of single bit digital to analog converter 100, respectively. Switched capacitor circuitries 106 and 108 operate in a similar fashion to switched capacitor circuitry 42 described above with reference to FIG. 2. During a high clocking signal (CK), corresponding capacitors 46 are charged with the voltage present on voltage outputs 103 and 104. Upon a low clocking signal $\overline{CK}$, capacitors 46 of switched capacitor circuitries 106 and integrating capacitor 130 redistribute or average their charge using common bus 114. Similarly, upon a low clocking signal $\overline{CK}$, capacitors 46 of switched capacitor circuitries 108 and integrating capacitor 122 redistribute or average their charge using common bus 115.

Due to the parallel arrangement of capacitors 46 of switched capacitor circuitries 106 and integrating capacitor 130, the voltage on output 132 of amplifier 120 is well-behaved and need not be sampled. Similarly, due to the parallel arrangement of capacitors 46 of switched capacitor circuitries 108 and integrating capacitor 122, the voltage on output 124 of amplifier 120 is also well-behaved and need not be sampled. This reduces the effects of aliased wideband noise. The voltage differential between outputs 124 and 132 of amplifier 120 comprise the analog signal 24 produced by digital to analog converter 16b.

Although the present invention has been described with several embodiments, a myriad of changes, variations, alterations, transformations, and modifications may be suggested to one skilled in the art, and it is intended that the present invention encompass such changes, variations, alterations, transformations, and modifications as fall within the spirit and scope of the appended claims.

What is claimed is:

1. A digital to analog conversion system, comprising:
    a noise shaper operable to receive a plurality of multibit signals at a first frequency, the noise shaper operable to generate a plurality of single bit signals at a second frequency greater than the first frequency; and
    a digital to analog converter coupled to the noise shaper, the converter comprising a plurality of weighted taps each having a capacitor, the digital to analog converter further comprising an amplifier having its input and output coupled to an integrating capacitor, the capacitors of the weighted taps and the integrating capacitor are coupled in parallel by a common bus.

2. The system of claim 1, wherein the second frequency is greater than the first frequency by an integer multiple.

3. The system of claim 1, wherein the noise shaper comprises sigma-delta circuitry.

4. The system of claim 1, comprising an interpolation filter coupled to the noise shaper, the interpolation filter operable to generate at least some of the multibit signals by interpolation.

5. The system of claim 1, wherein each weighted tap of the digital to analog converter comprises:
    a single bit digital to analog converter; and
    switched capacitor circuitry coupled to the single bit digital to analog converter.

6. The system of claim 1, wherein each weighted tap of the digital to analog converter comprises:
    a single bit digital to analog converter having a first voltage output and a second voltage output;
    a first switched capacitor circuitry coupled to the first voltage output of the single bit digital to analog converter; and
    a second switched capacitor circuitry coupled to the second voltage output of the single bit digital to analog converter.

7. The system of claim 1, wherein the output of the amplifier comprises an analog signal that is not sampled.

8. A digital to analog converter for converting a digital signal having a plurality of bits to an analog signal, the converter comprising:
    a plurality of weighted taps, each weighted tap having an associated capacitor, each weighted tap operable to charge its associated capacitor in response to a bit of the digital signal;
    an amplifier having an input and an output;
    an integrating capacitor coupled to the input and the output of the amplifier; and
    a common bus operable to couple the capacitors of the weighted taps and the integrating capacitor in parallel.

9. The converter of claim 8, comprising a delay line coupled to the weighted taps, the delay line having a plurality of delays arranged in series and operable to receive the plurality of bits and to communicate the plurality of bits to the weighted taps in parallel.

10. The converter of claim 8, wherein each weighted tap comprises a single bit digital to analog converter having a voltage output coupled to the capacitor.

11. The converter of claim 8, wherein each weighted tap comprises:
    a first switch coupled to the capacitor and operable to cause the capacitor to charge; and
    a second switch coupled to the capacitor and operable to cause the capacitor to discharge.

12. The converter of claim 8, wherein a tap weight for each weighted tap is determined by a selected capacitance of the associated capacitor.

13. The converter of claim 8, wherein the output of the amplifier comprises an analog signal that is not sampled.

14. A digital to analog converter for converting a digital signal having a plurality of bits into an analog signal, the converter comprising:

a plurality of weighted taps, each weighted tap having a first capacitor and a second capacitor, each weighted tap operable to charge the first capacitor and the second capacitor in response to a bit of the digital signal;

a first amplifier having an input and an output;

a first integrating capacitor coupled to the input and the output of the first amplifier;

a second amplifier having an input and an output;

a second integrating capacitor coupled to the input and the output of the second amplifier;

a first common bus operable to couple the first capacitors of the weighted taps and the first integrating capacitor in parallel; and a second common bus operable to couple the second capacitors of the weighted taps and the second integrating capacitor in parallel.

15. The converter of claim 14, comprising a delay line coupled to the weighted taps, the delay line having a plurality of delays arranged in series and operable to receive the digital signal and to communicate the digital signal to the weighted taps in parallel.

16. The converter of claim 14, wherein each weighted tap comprises a single bit digital to analog converter having a first output coupled to the first capacitor and a second output coupled to the second capacitor.

17. The converter of claim 14, and further comprising a switch coupled to the first capacitors and the second capacitors of the weighted taps and operable to cause the first capacitors and the second capacitors to charge.

18. The converter of claim 14, wherein each weighted tap comprises:

a single bit digital to analog converter having a first output coupled to the first capacitor and a second output coupled to the second capacitor;

a first switch coupled to the first capacitor and operable to cause the first capacitor to charge; and a second switch coupled to the second capacitor and operable to cause the second capacitor to charge.

19. The converter of claim 14, wherein:

a first tap weight for each weighted tap is determined by a selected capacitance of the associated first capacitor; and a second tap weight for each weighted tap is determined by a selected capacitance of the associated second capacitor.

20. The converter of claim 14, wherein:

the output of the first amplifier comprises a first analog signal that is not sampled; and the output of the second amplifier comprises a second analog signal that is not sampled.

* * * * *